United States Patent
Chen et al.

(10) Patent No.: US 9,716,112 B2
(45) Date of Patent: Jul. 25, 2017

(54) ARRAY SUBSTRATE, ITS MANUFACTURING METHOD AND DISPLAY DEVICE

(71) Applicants: BOE TECHNOLOGY GROUP CO., LTD., Beijing (CN); BEIJING BOE OPTOELECTRONICS TECHNOLOGY CO., LTD., Beijing (CN)

(72) Inventors: Lei Chen, Beijing (CN); Huanping Liu, Beijing (CN); Zhilong Peng, Beijing (CN); Wukun Dai, Beijing (CN)

(73) Assignees: BOE TECHNOLOGY GROUP CO., LTD., Beijing (CN); BEIJING BOE OPTOELECTRONICS TECHNOLOGY CO., LTD., Beijing (CN)

( * ) Notice: Subject to any disclaimer, the term of this patent is extended or adjusted under 35 U.S.C. 154(b) by 0 days.

(21) Appl. No.: 14/739,613

(22) Filed: Jun. 15, 2015

(65) Prior Publication Data

US 2016/0148952 A1    May 26, 2016

(30) Foreign Application Priority Data

Nov. 24, 2014    (CN) .......................... 2014 1 0679820

(51) Int. Cl.
  *H01L 27/12*    (2006.01)
(52) U.S. Cl.
  CPC ........ *H01L 27/124* (2013.01); *H01L 27/1244* (2013.01)
(58) Field of Classification Search
  None
  See application file for complete search history.

(56) References Cited

U.S. PATENT DOCUMENTS

| | | | |
|---|---|---|---|
| 5,668,379 A | * | 9/1997 | Ono .................... G02F 1/1368 257/347 |
| 2006/0138417 A1 | * | 6/2006 | Ahn .................... H01L 27/12 257/59 |

(Continued)

FOREIGN PATENT DOCUMENTS

| CN | 1577025 A | 2/2005 |
|---|---|---|
| CN | 103278987 A | 9/2013 |

(Continued)

OTHER PUBLICATIONS

First Office Action regarding Chinese application No. 201410679820.8, dated Sep. 7, 2016. Translation provided by Dragon Intellectual Property Law Firm.

*Primary Examiner* — Tom Thomas
*Assistant Examiner* — Steven B Gauthier
(74) *Attorney, Agent, or Firm* — Harness, Dickey & Pierce, P.L.C.

(57) ABSTRACT

The present disclosure relates to the field of display technology, and provides an array substrate, its manufacturing method and a display device. A signal line on the array substrate includes at least two conductive layers electrically connected to each other. When one of the conductive layers is broken, a signal may be transmitted through the other conductive layer(s). As a result, it is able to improve the reliability of the electrical connection of the signal line, thereby to improve the yield of the display device. Further, the plurality of conductive layers of the signal line is formed simultaneously in an existing process for manufacturing the conductive layer patterns for the array substrate, so it is unnecessary to form the signal line separately, and thereby the manufacturing process is simplified.

4 Claims, 6 Drawing Sheets

(56) References Cited

U.S. PATENT DOCUMENTS

| | | | | |
|---|---|---|---|---|
| 2008/0303024 | A1* | 12/2008 | Song | G02F 1/134363 |
| | | | | 257/59 |
| 2010/0200861 | A1* | 8/2010 | Lee | H01L 27/3276 |
| | | | | 257/72 |
| 2012/0097940 | A1* | 4/2012 | Kwon | H01L 27/124 |
| | | | | 257/43 |
| 2013/0092946 | A1 | 4/2013 | Ma et al. | |
| 2013/0342781 | A1* | 12/2013 | Lee | G02F 1/1368 |
| | | | | 349/46 |
| 2015/0318311 | A1* | 11/2015 | Cheng | H01L 27/124 |
| | | | | 257/43 |

FOREIGN PATENT DOCUMENTS

| | | | | |
|---|---|---|---|---|
| CN | 103354218 | * | 10/2013 | H01L 29/786 |
| CN | 204289448 U | | 4/2015 | |

\* cited by examiner

ARRAY SUBSTRATE, ITS MANUFACTURING METHOD AND DISPLAY DEVICE

CROSS-REFERENCE TO RELATED APPLICATION

The present application claims a priority of the Chinese patent application No. 201410679820.8 filed on Nov. 24, 2014, which is incorporated herein by reference in its entirety.

TECHNICAL FIELD

The present disclosure relates to the field of display technology, in particular to an array substrate, its manufacturing method and a display device.

BACKGROUND

Along with the development of the display technologies, a pixel per inch (PPI) of a display device becomes higher and higher, but a pixel aperture ratio remains unchanged and even it is increased slightly. In order to meet the above-mentioned requirements, a signal line arranged on an array substrate and configured to transmit a signal to a pixel unit becomes thinner and thinner. During the manufacture of the array substrate, the signal line is readily broken due to fluctuations in a manufacturing process and a device, or environmental influences.

SUMMARY

An object of the present disclosure is to provide an array substrate and its manufacturing method, so as to prevent a thin signal line from being broken during the manufacture.

Another object of the present disclosure is to provide a display device including the above-mentioned array substrate, so as to improve the yield thereof.

In one aspect, the present disclosure provides in one embodiment an array substrate, including a signal line for transmitting a signal. The signal line includes at least two conductive layers electrically connected to each other.

Alternatively, the array substrate is a thin film transistor (TFT) array substrate, and the signal line includes one or more of a gate line, a data line and a common electrode line; or the array substrate is an organic light-emitting diode (OLED) array substrate, and the signal line includes one or more of a gate line, a data line and a driver power line.

Alternatively, the array substrate is a TFT array substrate and includes a TFT. The gate line and the data line are arranged in a crisscross manner, the gate line is connected to a gate electrode of the TFT, and the data line is connected to a source electrode of the TFT. The common electrode line is configured to provide a reference voltage.

Alternatively, the array substrate further includes a pixel electrode, and the at least two conductive layers electrically connected to each other include a transparent conductive layer which is arranged at a layer identical to the pixel electrode.

Alternatively, the transparent conductive layer of the at least two conductive layers is of a width greater than the other conductive layer(s) of the at least two conductive layers.

Alternatively, the gate line, the data line and the common electrode line each include at least two conductive layers electrically connected to each other.

Alternatively, the gate line, the data line and the common electrode line each include two conductive layers electrically connected to each other.

Alternatively, the gate line includes a gate metal layer and a source/drain metal layer, the source/drain metal layer of the gate line is of a width not greater than the gate metal layer of the gate line, and the source/drain metal layer of the gate line is arranged at a layer identical to the data line.

Alternatively, the data line includes a source/drain metal layer and a gate metal layer, the gate metal layer of the data line is of a width not greater than the source/drain metal layer of the data line, and the gate metal layer of the data line is arranged at a layer identical to the gate line.

Alternatively, the common electrode line includes a gate metal layer and a source/drain metal layer, the gate metal layer of the common electrode line is arranged at a layer identical to the gate line, and the source/drain metal layer of the common electrode line is arranged at a layer identical to the data line.

In another aspect, the present disclosure provides in one embodiment a display device including the above-mentioned array substrate.

In yet another aspect, the present disclosure provides a method for manufacturing the above-mentioned array substrate, including a step of forming a signal for transmitting a signal, the signal line including at least two conductive layers electrically connected to each other.

Alternatively, the array substrate is a TFT array substrate, and the signal line includes one or more of a gate line, a data line and a common electrode line; or the array substrate is an OLED array substrate, and the signal line includes one or more of a gate line, a data line and a driver power line.

Alternatively, the array substrate is a TFT array substrate and includes a TFT. The method includes: forming a gate line and a data line in a crisscross manner, the gate line being connected to a gate electrode of the TFT, and the data line being connected to a source electrode of the TFT; and forming a common electrode line for providing a reference voltage.

Alternatively, the array substrate further includes a pixel electrode, and the at least two conductive layers electrically connected to each other include a transparent conductive layer. The method includes forming a transparent conductive thin film and patterning the transparent conductive thin film, so as to form the pixel electrode and the transparent conductive layer.

Alternatively, the gate line, the data line and the common electrode line each include a plurality of conductive layers electrically connected to each other.

Alternatively, the gate line, the data line and the common electrode line each include two conductive layers electrically connected to each other.

Alternatively, the gate line includes a gate metal layer and a source/drain metal layer, and the source/drain metal layer of the gate line is of a width not greater than the gate metal layer of the gate line. The method includes: forming a gate metal thin film and patterning the gate metal thin film so as to form the gate metal layer of the gate line; and forming a source/drain metal thin film and patterning the source/drain metal thin film so as to form a source/drain metal layer of the data line and the source/drain metal layer of the gate line.

Alternatively, the data line includes a source/drain metal layer and a gate metal layer, and the gate metal layer of the data line is of a width not greater than the source/drain metal layer of the data line. The method includes: forming a source/drain metal thin film and patterning the source/drain metal thin film, so as to form the source/drain metal layer of the data line; and forming a gate metal thin film and patterning the gate metal thin film, so as to form the gate metal layer of the gate line and the gate metal layer of the data line.

Alternatively, the common electrode line includes a gate metal layer and a source/drain metal layer. The method includes: forming a source/drain metal thin film and patterning the source/drain metal thin film, so as to form the source/drain metal layer of the data line and the source/drain metal layer of the common electrode line; and forming a gate metal thin film and patterning the gate metal thin film, so as to form the gate metal layer of the gate line and the gate metal layer of the common electrode line.

According to the embodiments of the present disclosure, the signal line arranged on the array substrate is provided with at least two conductive layers electrically connected to each other, and when one of the conductive layers is broken, the signal may still be transmitted through the conductive layer. As a result, it is able to improve the reliability for the electrical connection of the signal line, thereby to improve the yield of the display device. Further, the plurality of conductive layers of the signal line is formed simultaneously in an existing process for manufacturing the conductive layer patterns for the array substrate, so it is unnecessary to form the signal line separately, and thereby the manufacturing process is simplified.

BRIEF DESCRIPTION OF THE DRAWINGS

In order to illustrate the technical solutions of the present disclosure or the related art, the drawings used for the present disclosure or the related art will be described briefly hereinafter. Obviously, the following drawings merely relate to some embodiments of the present disclosure, and based on these drawings, a person skilled in the art may obtain the other drawings without any creative effort.

DETAILED DESCRIPTION

In order to prevent a thin signal line from being readily broken during the manufacture, the present disclosure provides in embodiments an array substrate. A signal line arranged on the array substrate and configured to transmit a signal includes at least two conductive layers electrically connected to each other. When one of the conductive layers is broken, the signal may be transmitted through the other conductive layer(s). As a result, it is able to improve the reliability for the electrical connection of the signal line, thereby to improve the yield of a display device.

Correspondingly, the present disclosure provides a method for manufacturing the array substrate, including forming a signal line for transmitting a signal, the signal line including at least two conductive layers electrically connected to each other.

For a TFT array substrate of a liquid crystal display device, the signal line includes a gate line, a data line and a common electrode line, and for an array substrate of an OLED display device, the signal line includes a gate line, a data line and a driver power line.

The present disclosure will be described hereinafter in conjunction with the drawings and embodiments. The following embodiments are for illustrative purposes only, but shall not be used to limit the present disclosure.

The following description is given by taking the TFT array substrate of the liquid crystal display device as an example. Of course, it should be appreciated that, the present disclosure may also be applied to the array substrate of the OLED display device.

Figure 1:
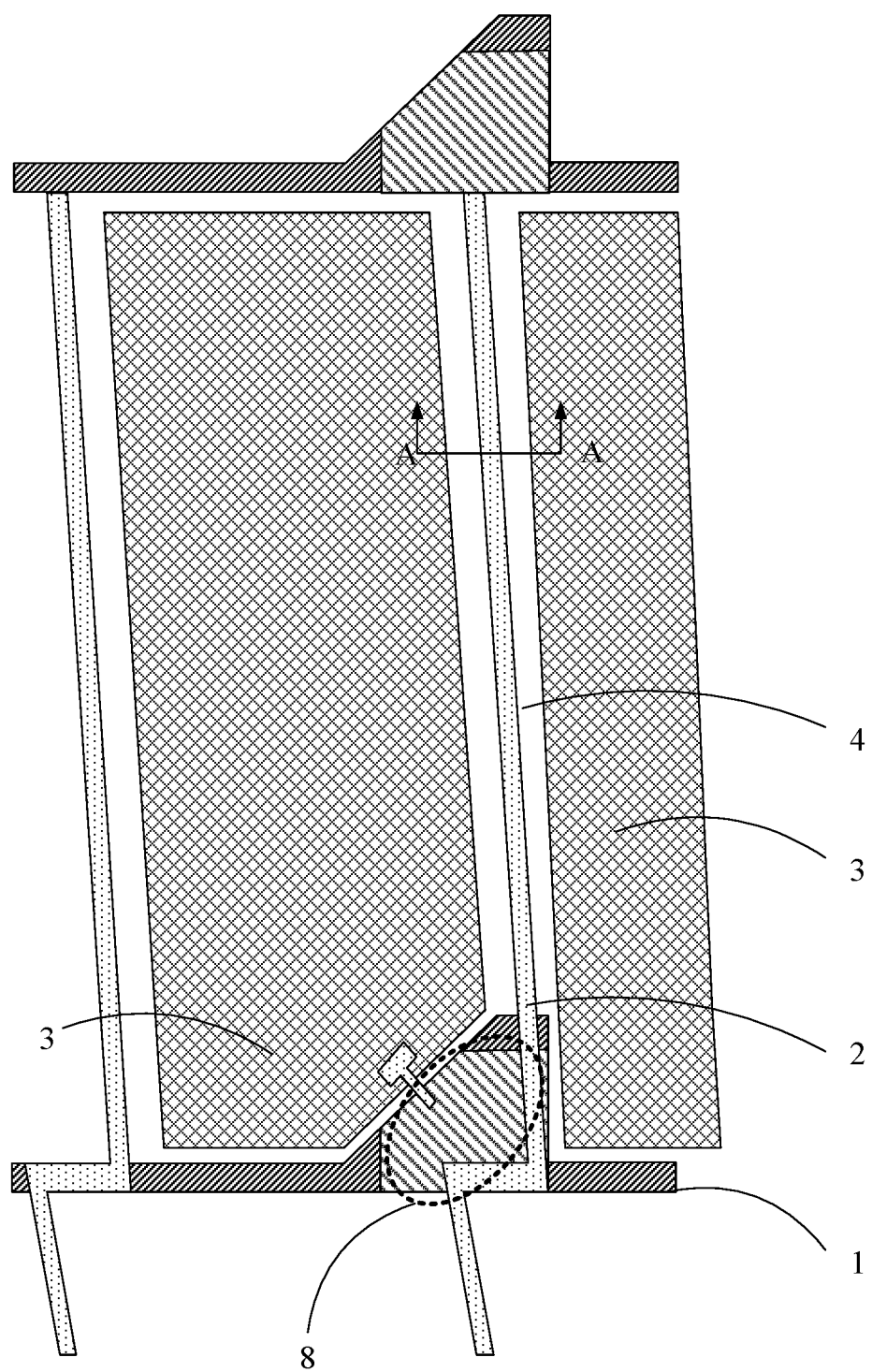
FIG. 1 is a schematic view showing an array substrate.

As a main structure of the liquid crystal display device, a liquid crystal panel includes a color filter substrate and an array substrate arranged opposite to each other to form a cell. As shown in FIG. 1, the TFT array substrate includes gate lines 1 and data lines 2 arranged in a crisscross manner, so as to define pixel regions. Each pixel region includes a TFT 8 and a pixel electrode 3. The pixel electrode 3 is electrically connected to a drain electrode of the TFT 8. The gate line 1 is connected to a gate electrode of the TFT 8, so as to transmit a scanning signal, thereby to turn on the TFTs row by row. The data line 2 is connected to source electrodes of the TFTs 8 in each column, so as to transmit pixel data. When the TFT 8 is turned on, a pixel voltage on the data line 2 is applied to the pixel electrode 3 via the TFT 8.

The liquid crystal panel further includes a common electrode formed on the array substrate or the color filter substrate, and a common electrode line (not shown) arranged on the array substrate and configured to provide a reference voltage to the common electrode. Liquid crystal molecules are deflected by a predetermined angle under the effect of an electric field formed by the common electrode and the pixel electrode 3, so as to achieve the image display.

Figure 2:
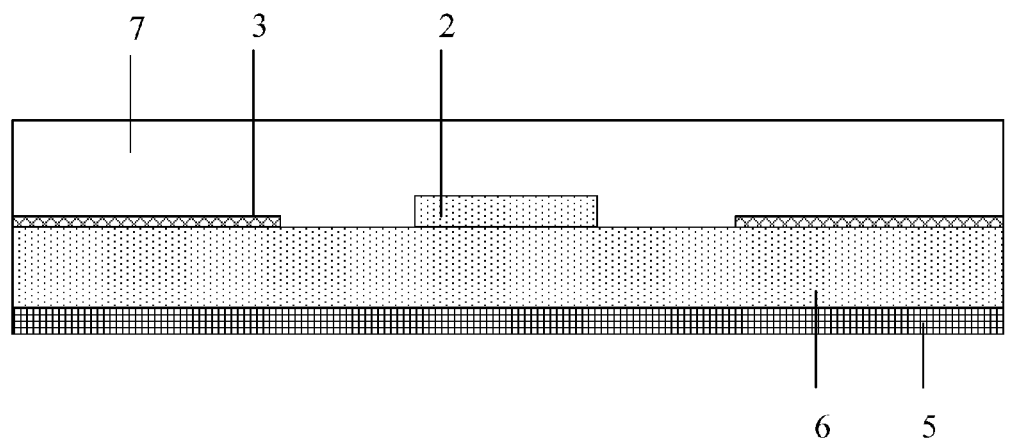
FIG. 2 is a sectional view of the array substrate in FIG. 1 along line A-A.

As shown in FIGS. 1 and 2, the gate line 1 and the gate electrode of the TFT 8 are formed by an identical gate metal thin film, i.e., they are formed integrally. The data line 2 and the source electrode of the TFT 8 are formed by an identical source/drain metal thin film, i.e., they are also formed integrally. The common electrode line may be formed integrally with the gate line 1 and the gate electrode through an identical gate metal thin film, or integrally with the data line 2 and the source electrode through an identical source/drain metal thin film.

In the embodiments of the present disclosure, one or more of the gate line, the data line and the common electrode line of the array substrate may each include at least two conductive layers electrically connected to each other, so as to prevent the thin signal line from being readily broken.

Correspondingly, the step of forming the signal line on the array substrate includes:

forming the gate lines 1 and the data lines 2 in a crisscross manner, the gate line 1 being connected to the gate electrode of the TFT 8, and the data line 2 being connected to the source electrode of the TFT 8; and forming the common electrode line for providing the reference voltage.

One or more of the gate line 1, the data line 2 and the common electrode line each include at least two conductive layers electrically connected to each other.

Alternatively, the gate line, the data line and the common electrode line each include at least two conductive layers electrically connected to each other. Usually, two conductive layers electrically connected to each other may be enough to meet the requirement, and at this time the manufacturing process is simple.

Alternatively, one of the conductive layers of the signal line is a transparent conductive layer, which is arranged at a layer identical to the pixel electrode (i.e., which is formed integrally with the pixel electrode by an identical transparent conductive thin film). As a result, it is unnecessary to form the transparent conductive layer by a separate manufacturing process. To be specific, the transparent conductive thin film is formed and patterned, so as to form the pixel electrode and the transparent conductive layer of the at least two conductive layers electrically connected to each other.

The transparent conductive thin film may be made of indium tin oxide (ITO) or indium zinc oxide (IZO). The patterning process includes coating, exposing and developing a photoresist, and etching the transparent conductive thin film by using the photoresist as a barrier, so as to form the pixel electrode and the transparent conductive layer of the at least two conductive layers.

A pixel aperture ratio will not be adversely affected by the transparent conductive layer, so the transparent conductive layer of the signal line may be of a width greater than the other conductive layer(s), so as to ensure that the transparent conductive layer is not broken due to fluctuations in the manufacturing process and device, or environmental influences, thereby to ensure the transmission performance of the signal line. Of course, the transparent conductive layer of the signal line may also be of a width not greater than the other conductive layer(s).

When one of the conductive layers of the signal line is the transparent conductive layer, the gate line of the TFT array substrate may include a gate metal layer and the transparent conductive layer, or the gate metal layer, the transparent conductive layer and a source/drain metal layer; the data line may include a source/drain metal layer and the transparent conductive layer, or a gate metal layer, the transparent conductive layer and the source/drain metal layer; and the common signal line may include a source/drain metal layer and the transparent conductive layer, or a gate metal layer and the transparent conductive layer, or the gate metal layer, the transparent conductive layer and the source/drain metal layer. The gate metal layer of the above siganl line may be arranged at a layer identical to the gate line, and formed by a gate metal thin film. The source/drain metal layer of the above signal line may be arranged at a layer identical to the data line, and formed by a source/drain metal thin film. The plurality of conductive layers of the signal line may be formed in the existing process for manufacturing the conductive layer patterns, so it is unnecessary to form the signal line separately, and thereby the manufacturing process for the array substrate is simplified.

In order not to adversely affect the pixel aperture ration, when a newly-added conductive layer of the signal line includes a nontransparent conductive layer, this nontransparent conductive layer is of a width not greater than an original conductive layer.

It should be appreciated that, the original conductive layer of the signal line in the embodiments of the present disclosure refers to the only conductive layer included in the existing signal line. For example, the original conductive layer of the gate line is just the gate metal layer, the original conductive layer of the data line is just the source/drain metal layer, and the original conductive layer of the common electrode line is just the gate metal layer or the source/drain metal layer.

In an alternative embodiment, the signal line on the array substrate includes two conductive layers, and one of the conductive layer is not a transparent conductive layer, i.e., it is made of a material other than a transparent metal material. For example, the gate line includes a gate metal layer and a source/drain metal layer, the data line includes a gate metal layer and a source/drain metal layer, and the common electrode line includes a gate metal layer and a source/drain metal layer. The source/drain metal layer of the gate line may be arranged at a layer identical to the data line, and formed by a source/drain metal thin film. The gate metal layer of the data line is arranged at a layer identical to the gate line, and formed by a gate metal thin film. The gate metal layer of the common electrode line is arranged at a layer identical to the gate line, and formed by a gate metal thin film. The source/drain metal layer of the common electrode line is arranged at a layer identical to the data line, and formed by a source/drain metal thin film.

Further, in order not to adversely affect the pixel aperture ratio, the nontransparent conductive layer of the signal line is of a width not greater than the original conductive layer. In other words, the source/drain metal layer of the gate line is of a width not greater than the gate metal layer, and the gate metal layer of the data line is of a width not greater than the source/drain metal layer.

The method for manufacturing the TFT array substrate includes:

forming a gate metal thin film and patterning the gate metal thin film, so as to form the gate metal layer of the gate line, the gate metal layer of the data line and the gate metal layer of the common electrode line; and forming a source/drain metal thin film and patterning the source/drain metal thin film, so as to form the source/drain metal layer of the data line, the source/drain metal layer of the gate line, and the source/drain metal layer of the common electrode line.

Figure 3:
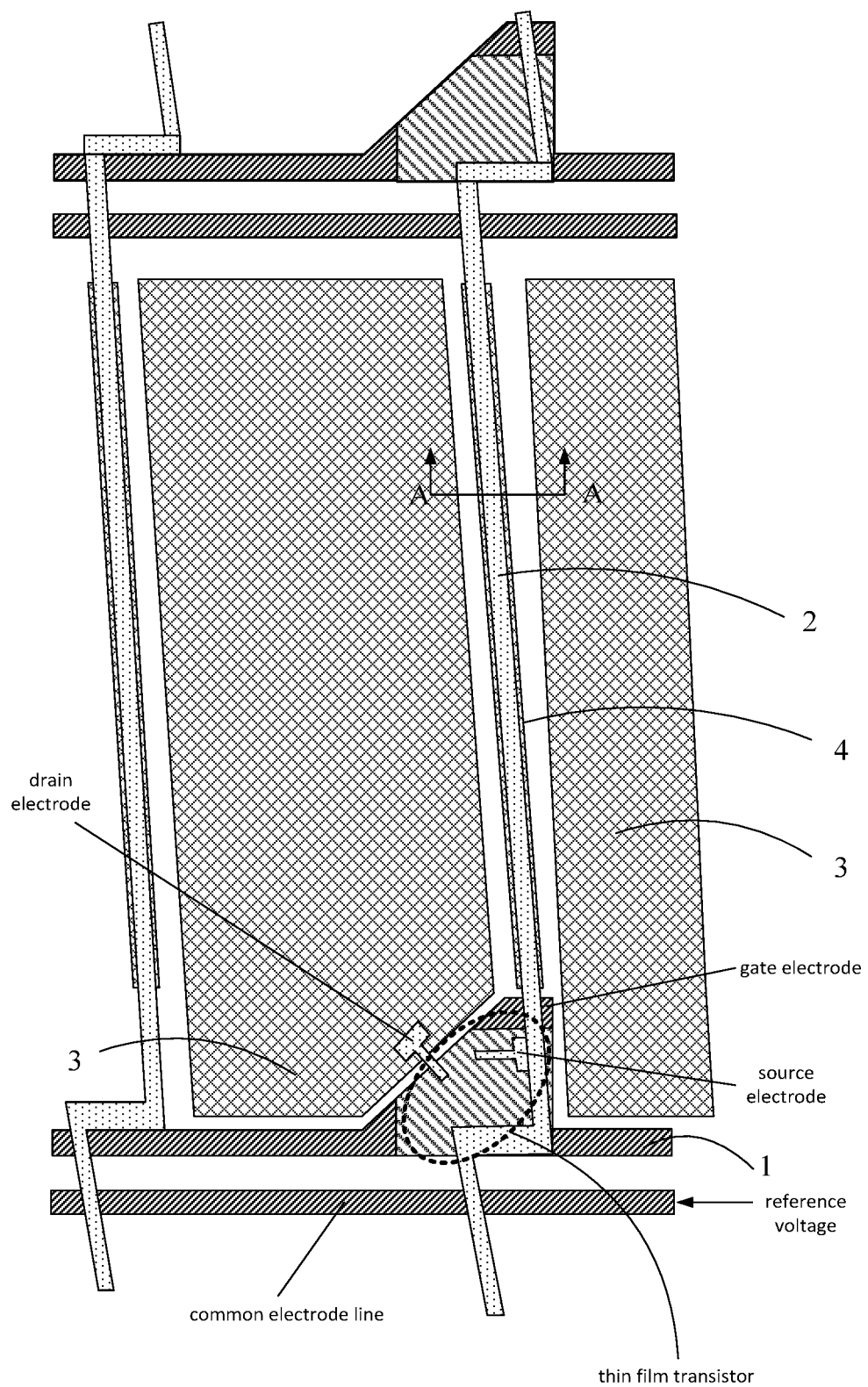
FIG. 3 is a schematic view showing an array substrate according to one embodiment of the present disclosure.
Figure 4:
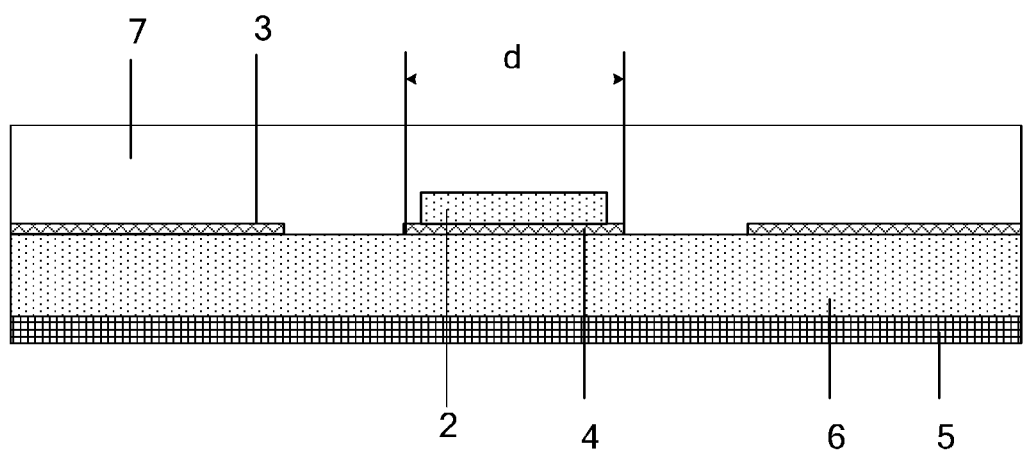
FIG. 4 is a sectional view of the array substrate in FIG. 3 along line A-A.

FIGS. 3 and 4 show the TFT array substrate where the data line includes two conductive layers (one of which is a transparent conductive layer). The method for manufacturing the TFT array substrate includes the following steps.

Step S1: providing a transparent base substrate 5, e.g., a glass substrate, a quartz substrate or an organic resin substrate.

Step S2: forming the gate electrode (not shown), the gate line 1 and the common electrode line (not shown) on the base substrate 5. The gate electrode, the gate line 1 and the common electrode line are formed by an identical gate metal thin film, and the gate metal thin film may be made of Cu, Al, Ag, Mo, Cr, Nd, Ni, Mn, Ti, Ta or W, or an alloy thereof. The gate metal layer may be of a single-layered structure, or a multi-layered structure such as Cu/Mo, Ti/Cu/Ti, or Mo/Al/Mo.

Step S3: forming a gate insulating layer 6 on the base substrate 5 obtained after Step S2. The gate insulating layer 6 may be made of an oxide, a nitride or an oxynitride, and it may be of a single-layered, double-layered or multi-layered structure. To be specific, the gate insulating layer 6 may be made of $SiN_x$, $SiO_x$ or $Si(ON)_x$.

Step S4: forming an active layer pattern (not shown) on the base substrate 5 obtained after Step S3. The active layer may be made of a silicon semiconductor, or a metal oxide semiconductor.

Step S5: forming the pixel electrode 3 and the transparent conductive layer 4 of the data line 2 on the base substrate 5 obtained after Step S4. The pixel electrode 3 and the transparent conductive layer 4 may be formed by an identical transparent conductive thin film which may be made of ITO or IZO.

Step S6: forming the source electrode, the drain electrode and the source/drain metal layer of the data line 2 on the base substrate 5 obtained after Step S5. As shown in FIG. 4, the transparent conductive layer 4 is of a width d greater than the source/drain metal layer of the data line 2. The source electrode, the drain electrode and the source/drain metal layer of the data line 2 are formed by an identical source/drain metal thin film which may be made of Cu, Al, Ag, Mo, Cr, Nd, Ni, Mn, Ti, Ta or W or an alloy thereof. The source/drain metal thin film may be of a single-layered structure, or a multi-layered structure such as Cu/Mo, Ti/Cu/Ti, or Mo/Al/Mo.

Step S7: forming a passivation layer 7 on the base substrate 5 obtained after Step S6. The passivation layer 7 may be made of an oxide, a nitride or an oxynitride, and it may be of a single-layered, double-layered or multi-layered structure. To be specific, the passivation layer 7 may be made of SiNx, SiOx or Si(ON)x.

Step S8: forming a slit common electrode (not shown) on the base substrate 5 obtained after Step S7. The slit common electrode is electrically connected to the common electrode line through a via-hole in the passivation layer 7. The slit common electrode is formed by the transparent conductive thin film.

Figure 5:
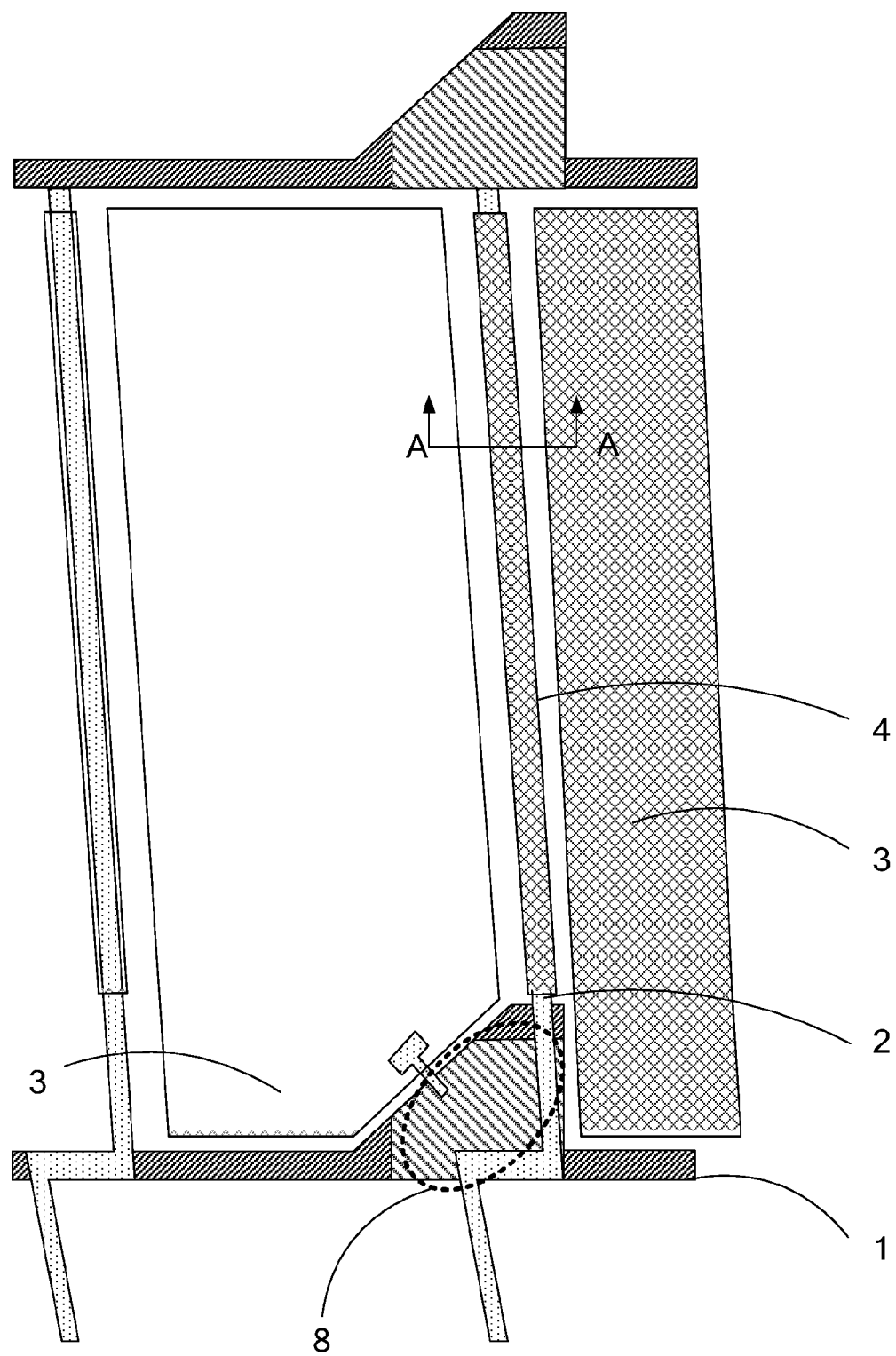
FIG. 5 is a schematic view showing the array substrate according to another embodiment of the present disclosure.
Figure 6:
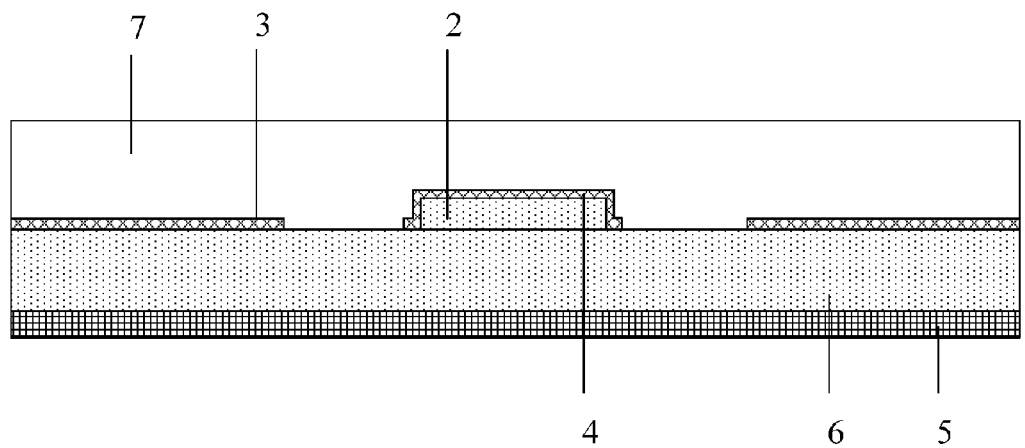
FIG. 6 is a sectional view of the array substrate in FIG. 5 along line A-A.

In the above-mentioned structure, a driving electric field of the liquid crystal panel is a horizontal one, and the common electrode is formed on the array substrate. The TFT array substrate is of a bottom-gate structure, and the data line 2 includes the source/drain metal layer and the transparent conductive layer 4. The transparent conductive layer 4 of the data line arranged below the source/drain metal layer of the data line, and has a width greater than the source/drain metal layer. As shown in FIGS. 5 and 6, Step S6 may be performed prior to Step S5, so as to form the transparent conductive layer 4 of the data line 2 above the source/drain metal layer.

When the driving electric field of the liquid crystal panel is a longitudinal one and the common electrode is formed on the color filter substrate, it is merely required to cover the TFT 8 with the passivation layer 7.

When the gate line and the common electrode line on the array substrate also include the transparent conductive layers, the transparent conductive layers of the gate line 1 and the common electrode line may be formed while forming the pixel electrode 3.

When the gate line 1 and the common electrode line on the array substrate include the source/drain metal layers, the source/drain metal layers of the gate line 1 and the common electrode line may be formed while forming the source electrode and the drain electrode.

When the data line 2 and the common electrode line on the array substrate include the gate metal layers, the gate metal layers of the data line 2 and the common electrode line may be formed while forming the gate electrode.

The present disclosure may also be applied to the TFT array substrate of a top-gate structure, or a coplanar TFT array substrate.

When the present disclosure is applied to the OLED display device, the process for manufacturing the newly-added conductive layers of the signal line is similar to that for the TFT array substrate, and thus will not be particularly defined herein.

The present disclosure further provides in one embodiment a display device including the above-mentioned array substrate, so as to improve the product yield.

According to the embodiments of the present disclosure, the signal line arranged on the array substrate includes at least two conductive layers electrically connected to each other, and when one of the conductive layers is broken, the signal may still be transmitted through the other conductive layer. As a result, it is able to improve the reliability for the electrical connection of the signal line, thereby to improve the yield of the display device. Further, the plurality of conductive layers of the signal line is formed simultaneously in an existing process for manufacturing the conductive layer patterns for the array substrate, so it is unnecessary to form the signal line separately, and thereby the manufacturing process is simplified.

The above are merely the preferred embodiments of the present disclosure. It should be appreciated that, a person skilled in the art may make further modifications and improvements without departing from the principle of the present disclosure, and these modifications and improvements shall also fall within the scope of the present disclosure.

What is claimed is:

1. An array substrate, comprising a signal line for transmitting a signal, wherein the signal line comprises at least two conductive layers electrically connected to each other;

the array substrate comprising a thin film transistor (TFT) array substrate, the thin film transistor (TFT) array substrate comprising a thin film transistor (TFT) and a pixel electrode, and the signal line including one or more of a gate line, a data line, and a common electrode line, wherein the gate line and the data line of the thin film transistor (TFT) array substrate are arranged in a crisscross manner, the gate line is connected to a gate electrode of the thin film transistor (TFT), the data line is connected to a source electrode of the thin film transistor (TFT), and the common electrode line is configured to provide a reference voltage, and the data line of the thin film transistor (TFT) array substrate comprises the at least two conductive layers electrically connected to each other, the at least two conductive layers including a transparent conductive layer arranged below a source/drain metal layer and at a layer identical to the pixel electrode, wherein the transparent conductive layer of the data line comprises a width greater than a width of the source/drain metal layer of the data line.

2. A display device comprising the array substrate according to claim 1.

3. A method for manufacturing an array substrate, wherein the array substrate comprises a signal line for transmitting a signal, wherein the signal line comprises at least two conductive layers electrically connected to each other;

the array substrate comprising a thin film transistor (TFT) array substrate, the thin film transistor (TFT) array substrate comprising a thin film transistor (TFT) and a pixel electrode, and the signal line including one or more of a gate line, a data line, and a common electrode line, wherein the gate line and the data line of the thin film transistor (TFT) array substrate are arranged in a crisscross manner, the gate line is connected to a gate electrode of the thin film transistor (TFT), the data line is connected to a source electrode of the thin film transistor (TFT), and the common electrode line is configured to provide a reference voltage, and the data line of the thin film transistor (TFT) array substrate comprises the at least two conductive layers electrically connected to each other, the at least two conductive layers including a transparent conductive layer arranged below a source/drain metal layer and at a layer identical to the pixel electrode, wherein the transparent conductive layer of the data line is of a width greater than the source/drain metal layer of the data line;

the method comprising:

forming the gate line and the data line of the thin film transistor (TFT) array substrate in a crisscross manner; and forming a common electrode line of the thin film transistor (TFT) array substrate;

wherein the forming the gate line and the data line of the thin film transistor (TFT) array substrate in a crisscross manner further comprises forming the source/drain metal layer and the transparent conductive layer of the data line.

4. The method according to claim 3, wherein the forming the source/drain metal layer and the transparent conductive layer of the data line further comprises:

forming a transparent conductive thin film and patterning the transparent conductive thin film to form the pixel electrode and the transparent conductive layer of the data line.

* * * * *